United States Patent
Nair et al.

(10) Patent No.: US 11,195,806 B2
(45) Date of Patent: Dec. 7, 2021

(54) HIGH FREQUENCY WAVEGUIDE STRUCTURE

(71) Applicant: Intel Corporation, Santa Clara, CA (US)

(72) Inventors: Vijay K. Nair, Mesa, AZ (US); Digvijay Ashokkumar Raorane, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/348,698

(22) PCT Filed: Dec. 29, 2016

(86) PCT No.: PCT/US2016/069248
§ 371 (c)(1),
(2) Date: May 9, 2019

(87) PCT Pub. No.: WO2018/125150
PCT Pub. Date: Jul. 5, 2018

(65) Prior Publication Data
US 2019/0267337 A1   Aug. 29, 2019

(51) Int. Cl.
| | |
|---|---|
| *H01L 23/66* | (2006.01) |
| *H01L 23/48* | (2006.01) |
| *H01L 23/538* | (2006.01) |
| *H01P 3/12* | (2006.01) |
| *H01P 11/00* | (2006.01) |

(Continued)

(52) U.S. Cl.
CPC ........... *H01L 23/66* (2013.01); *H01L 23/481* (2013.01); *H01L 23/5381* (2013.01); *H01P 3/121* (2013.01); *H01P 11/002* (2013.01); *H04B 7/00* (2013.01); *H01L 25/0655* (2013.01); *H01L 2223/6616* (2013.01); *H01L 2223/6627* (2013.01); *H01L 2223/6688* (2013.01); *H01L 2224/16227* (2013.01); *H01L 2224/17181* (2013.01); *H01L 2924/15192* (2013.01)

(58) Field of Classification Search
None
See application file for complete search history.

(56) References Cited

U.S. PATENT DOCUMENTS

| | | | | |
|---|---|---|---|---|
| 7,809,220 B2 * | 10/2010 | Kim | ........................ | G02B 6/43 385/14 |
| 8,227,904 B2 * | 7/2012 | Braunisch | ........... | H01L 25/0655 257/686 |

(Continued)

OTHER PUBLICATIONS

International Search Report and Written Opinion for International Patent Application No. PCT/US2016/069248, dated Jul. 11, 2019, 11 pages.

(Continued)

*Primary Examiner* — Benjamin P Sandvik
(74) *Attorney, Agent, or Firm* — Schwabe, Williamson & Wyatt, P.C.

(57) ABSTRACT

An integrated circuit (IC) comprises a substrate, a first die mounted on the substrate, a second die mounted on the substrate and a waveguide structure mounted on the first die and the second die to enable high frequency wireless communication between the first die and the second die.

20 Claims, 7 Drawing Sheets

(51) Int. Cl.
*H04B 7/00* (2006.01)
*H01L 25/065* (2006.01)

(56) References Cited

U.S. PATENT DOCUMENTS

| | | | | |
|---|---|---|---|---|
| 2003/0103712 A1* | 6/2003 | Glebov | ............... | G02B 6/12004 |
| | | | | 385/14 |
| 2007/0104413 A1* | 5/2007 | Hsu | ............... | H01L 23/48 |
| | | | | 385/14 |
| 2008/0240656 A1* | 10/2008 | Rollin | ............... | H05K 1/0221 |
| | | | | 385/50 |
| 2012/0261838 A1 | 10/2012 | Braunisch et al. | | |
| 2013/0265732 A1* | 10/2013 | Herbsommer | ....... | G02B 6/1228 |
| | | | | 361/774 |
| 2013/0330035 A1* | 12/2013 | Shin | ............... | G02B 6/4207 |
| | | | | 385/14 |
| 2014/0091474 A1* | 4/2014 | Starkston | ............... | H01L 24/14 |
| | | | | 257/774 |
| 2014/0092576 A1* | 4/2014 | Lucero | ............... | G02B 6/428 |
| | | | | 361/783 |
| 2014/0254979 A1 | 9/2014 | Zhang et al. | | |
| 2014/0264400 A1 | 9/2014 | Lipson et al. | | |
| 2014/0285294 A1 | 9/2014 | Haroun et al. | | |
| 2015/0280320 A1 | 10/2015 | Haroun et al. | | |
| 2016/0276729 A1* | 9/2016 | Dang | ............... | H01Q 1/48 |
| 2017/0068049 A1* | 3/2017 | Dangel | ............... | G02B 6/1221 |

OTHER PUBLICATIONS

International Search Report and Written Opinion for International Patent Application No. PCT/US2016/069248 dated Sep. 27, 2017, 13 pgs.

* cited by examiner

HIGH FREQUENCY WAVEGUIDE STRUCTURE

CROSS-REFERENCE TO RELATED APPLICATION

This patent application is a U.S. National Phase Application under 35 U.S.C. § 371 of International Application No. PCT/US2016/069248, filed Dec. 29, 2016, entitled "HIGH FREQUENCY WAVEGUIDE STRUCTURE," which designates the United States of America, the entire disclosure of which is hereby incorporated by reference in its entirety and for all purposes.

FIELD

The present disclosure generally relates to waveguide structures integrated a system on chip (SOC) for high frequency wireless communication.

BACKGROUND

Servers and other high performance computing platforms require high-speed data transfers between computer systems. High-density copper connections and embedded multi-die interconnect bridges (EMIB), or silicon bridges, are utilized to achieve interconnections between integrated circuits (ICs) to enable such high-speed data transfers. However as the frequency of operation increases, copper interconnect loss increases due to metal surface roughness. Further, the interconnects are subjected to cross-talk interferences and spurious noise pick up. These interconnect issues deteriorate the quality of the signals. Moreover, future ICs are expected to have high frequency millimeter wave transceiver circuits in addition to high speed digital circuits in the same SOC die. Thus, signal interference between RF and digital signals would become severe if adequate remedial action is not taken.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention.

Figure 1A:
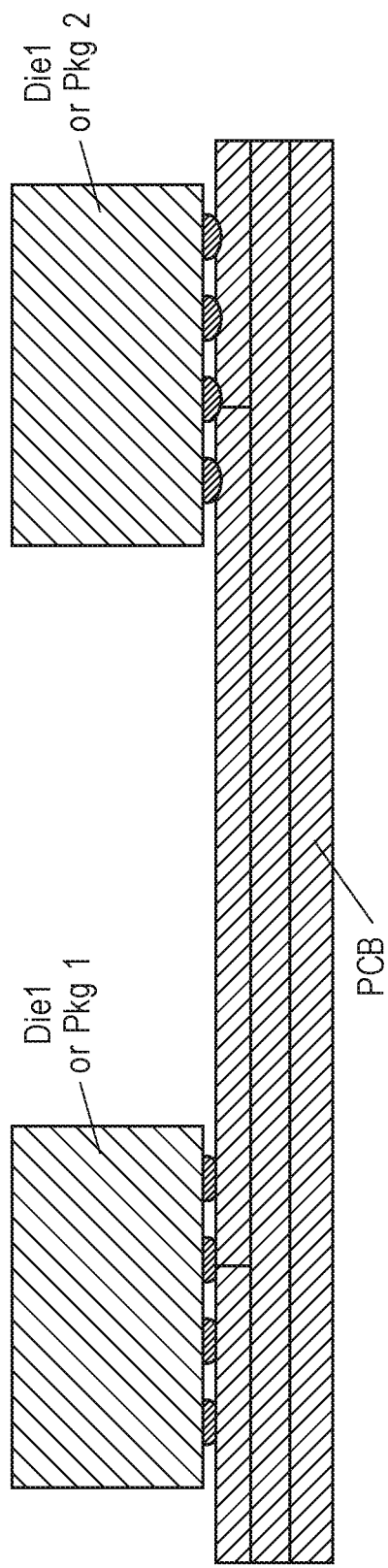
FIGS. 1A & 1B illustrate conventional data transmission interconnects.
Figure 1B:
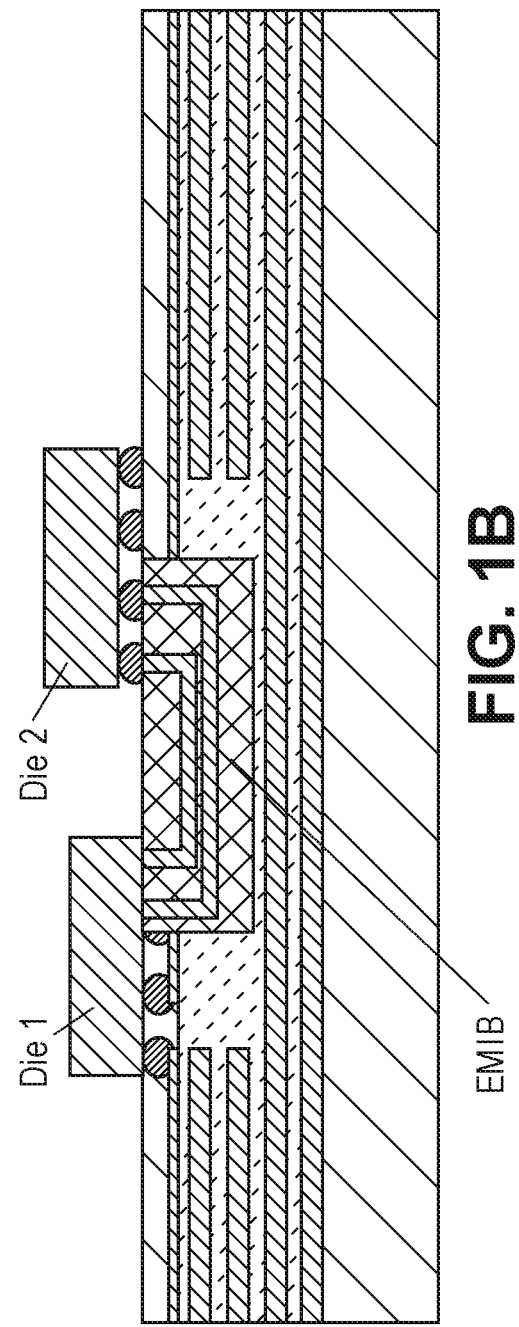

FIGS. 1A & 1B illustrate conventional data transmission interconnects. FIG. 1A illustrates data transmission from a first device (e.g., die (or package 1)) to a second device (e.g., die (or package 2)) via copper lines in a printed circuit board (PCB) or package substrate. FIG. 1B illustrates a data transmission device using an EMIB or silicon bridge. As discussed above, such interconnects suffer from limitations that may lead to deterioration of signal quality.

Figure 2:
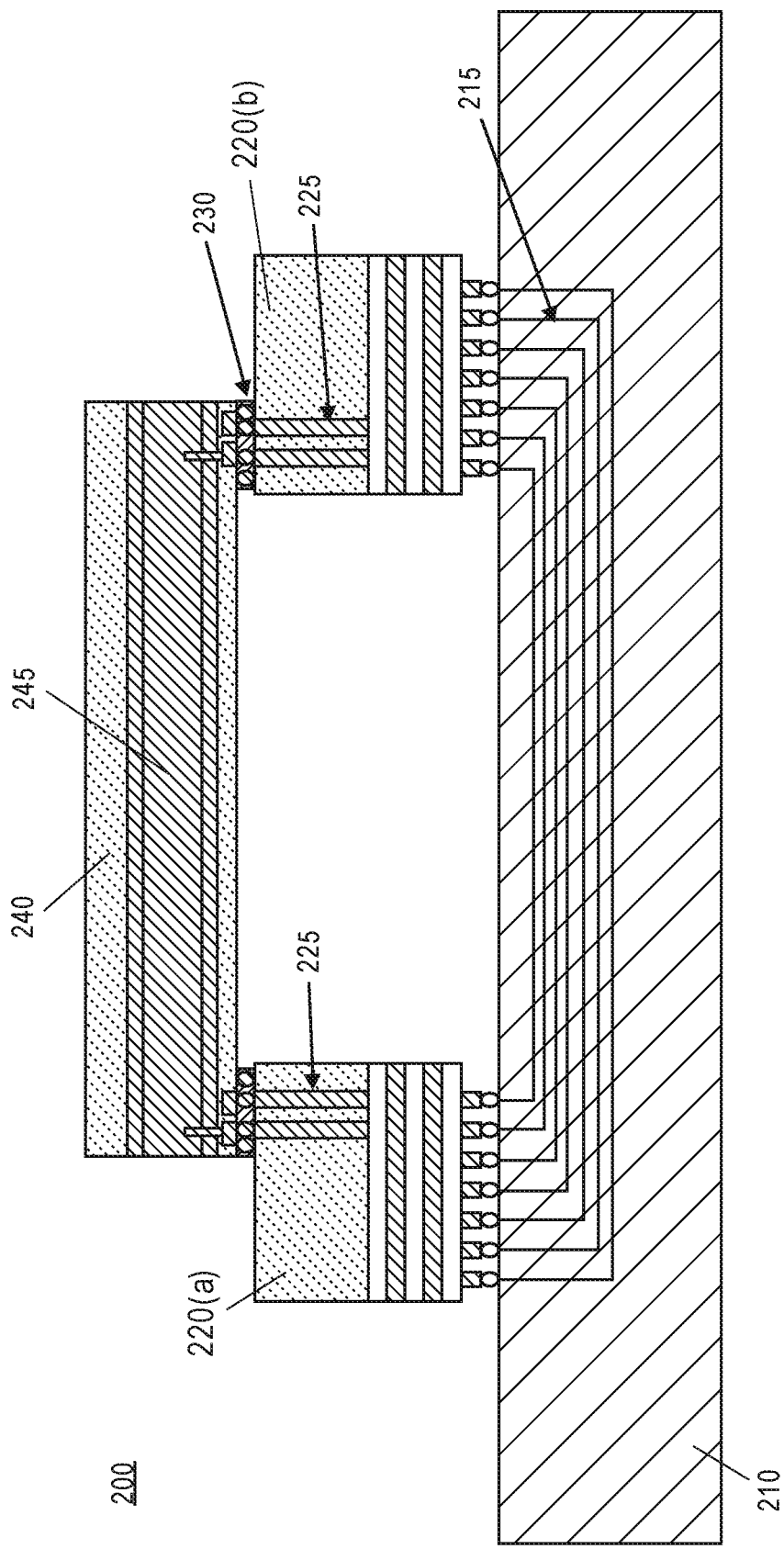
FIG. 2 illustrates one embodiment of a high frequency data transmission interconnect.

According to one embodiment, a novel waveguide structure is disclosed to enable high frequency wireless transmission and high-speed digital transmission between ICs. In such an embodiment, the waveguide structure is attached to the top of SOC dies using through silicon vias (TSVs) to enable the high frequency wireless communication path to be separated and isolated from the high speed digital communication path. FIG. 2 illustrates one embodiment of a system 200 including such a high frequency data transmission interconnect. System 200 includes die 220 (e.g., 220(a) and 220(b)) mounted on a substrate 210. In other embodiments, system 200 may feature ICs mounted on a printed circuit board (PCB), such that ICS 220(a) and 220(b) are mounted on PCB 210.

In one embodiment, a substrate bridge 215 couples die 220(a) and 220(b) to facilitate a high speed digital communication path, while a waveguide 240 is mounted on die 220(a) and 220(b) to facilitate the high frequency wireless communication path. In one embodiment, system 200 include TSV dies 225 to interconnect die 220(a) and 220(b) and waveguide 240. TSV dies 225 operate as conduits for wireless signals to waveguide 240. Further, contact pads 230 couple waveguide 240 to die 220(a) and 220(b). In one embodiment, contact pads 230 implement an anisotropic conductive film (ACF) or anisotropic conductive adhesive (ACA) using thermal compressive bonding. In other embodiments multiple die may be combined to form a big junction in order to exchange signals.

As shown in FIG. 2, waveguide 240 is a completely enclosed system enabling high frequency RF signal transmission to be contained within the waveguide. In one embodiment, waveguide 240 is suitable for the desired frequency range, and is constructed separately and attached to pads 230. For instance, waveguide 240 may exchange signals for multiple wavelengths by offering multiple channels within waveguide or multiple modes of propagation within the channel. In a further embodiment, waveguide 240 is an air filled or low loss dielectric, with up to ten signals capable of being carried.

Figure 3:
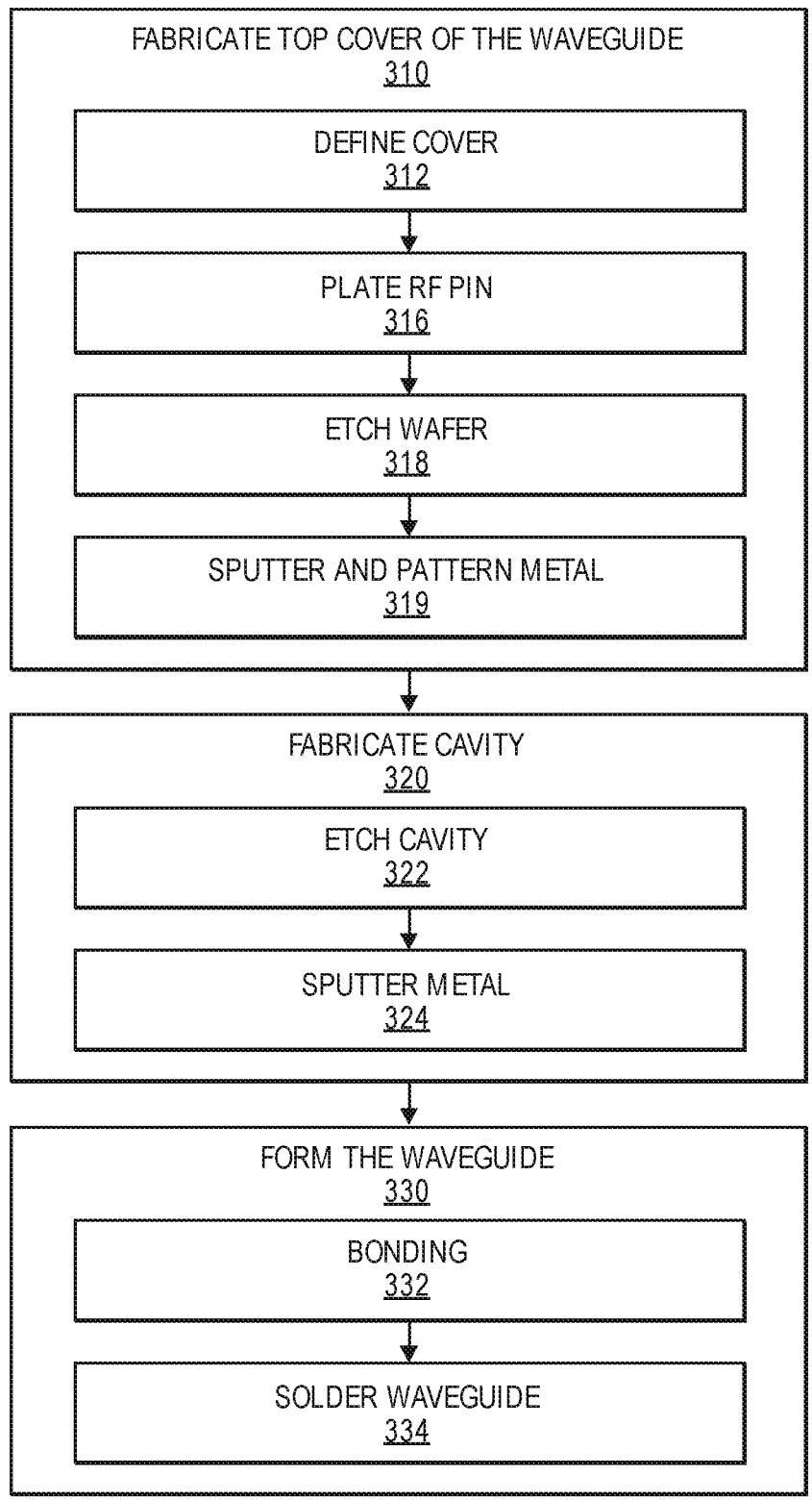
FIG. 3 is a flow diagram illustrating one embodiment of a process for fabricating a waveguide for high frequency data transmission interconnect.
Figure 4A:
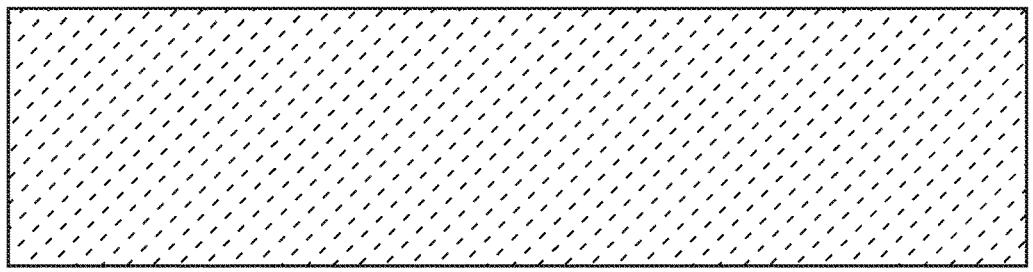
FIGS. 4A-4J illustrate embodiments of a waveguide during fabrication.
Figure 4B:
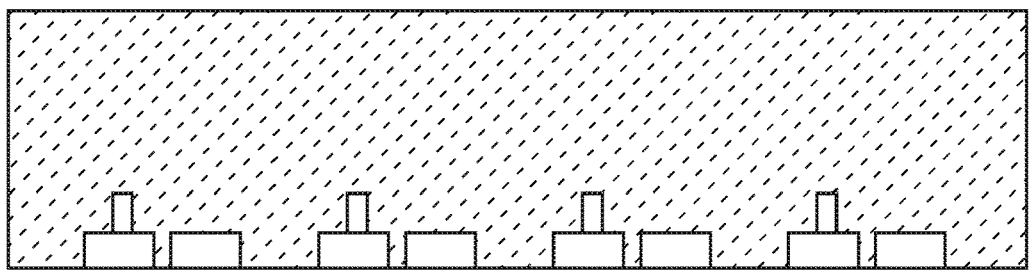

FIG. 3 is a flow diagram illustrating one embodiment of a process for fabricating waveguide 240. At processing block 310, the top cover of a waveguide, such as waveguide 240 is fabricated. In one embodiment, fabricating the cover includes defining the cover using a first Si wafer, processing block 312. FIG. 4A illustrates one embodiment of the top cover of the waveguide after processing block 312 has been performed. At processing block 314, the wafer is patterned to create an RF pin. FIG. 4B illustrates one embodiment of the top cover after processing after patterning for the RF pin.

Figure 4C:
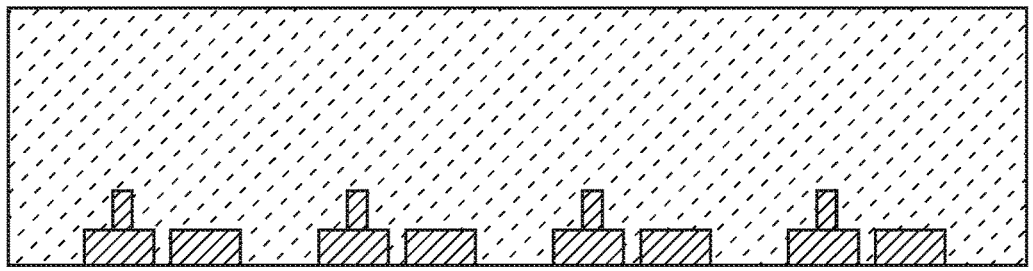
Figure 4D:
Figure 4E:

At processing block 316, a copper (Cu) plate is applied on to the RF pin. FIG. 4C illustrates one embodiment of the wafer after the Cu plate has been added. At processing block 318, the wafer is etched. In one embodiment, etching the wafer exposes the RF pin. FIG. 4D illustrates one embodiment of the wafer after the wafer has been etched. At processing block 319 metal is sputtered and patterned on the cavity to define the waveguide. In one embodiment, 50 nm of chromium (Cr) is sputtered on the Si, followed by sputtering gold (Au) up to 300 nm. FIG. 4E illustrates one embodiment of the wafer after sputtering and patterning metal on to the cavity.

Figure 4F:
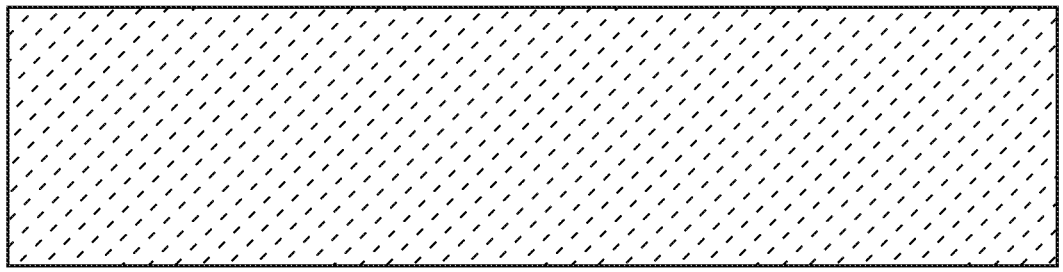
Figure 4G:
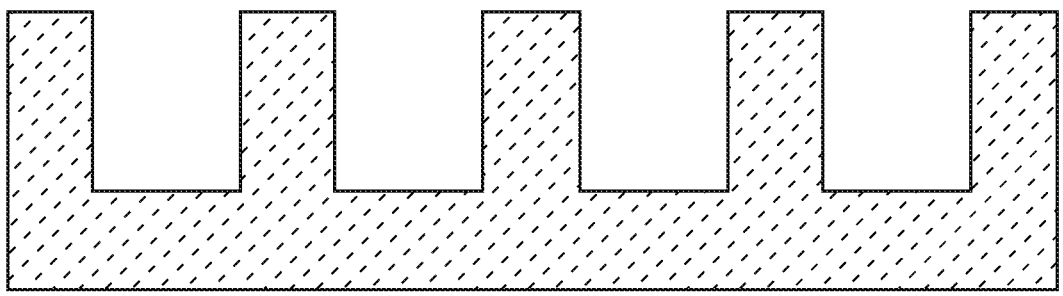
Figure 4H:
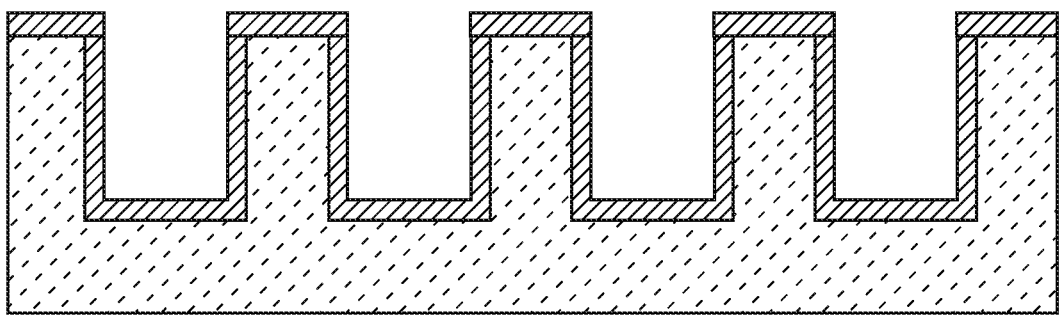

At processing block 320, a process is performed to fabricate a cavity of the waveguide is fabricated. In one embodiment cavity fabrication includes etching a cavity into a second wafer, processing block 322. FIG. 4F illustrates one embodiment of the second wafer prior to etching the cavity, while FIG. 4G illustrates one embodiment of the second wafer. At processing block 324, metal is sputtered on the cavity to define the waveguide. In one embodiment, 50 nm of chromium (Cr) is sputtered on the Si, followed by sputtering gold (Au) up to 300 nm. FIG. 4H illustrates one embodiment of the second wafer after sputtering metal on to the cavity.

Figure 4I:
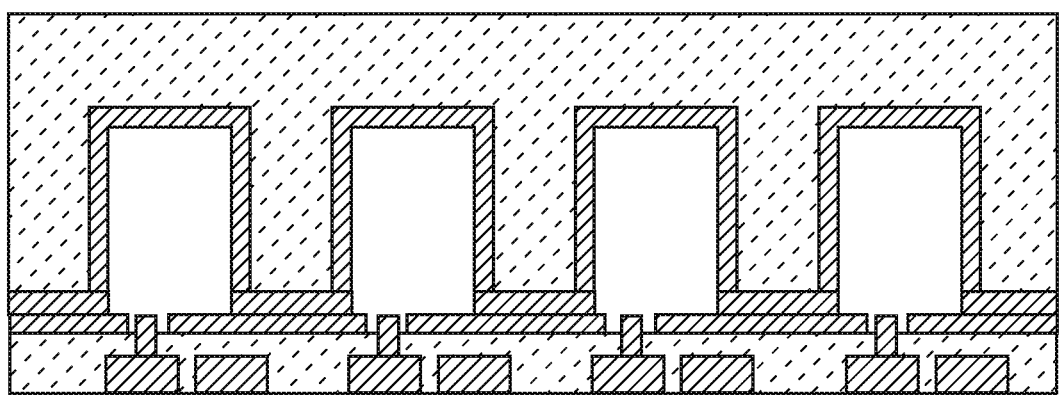
Figure 4J:
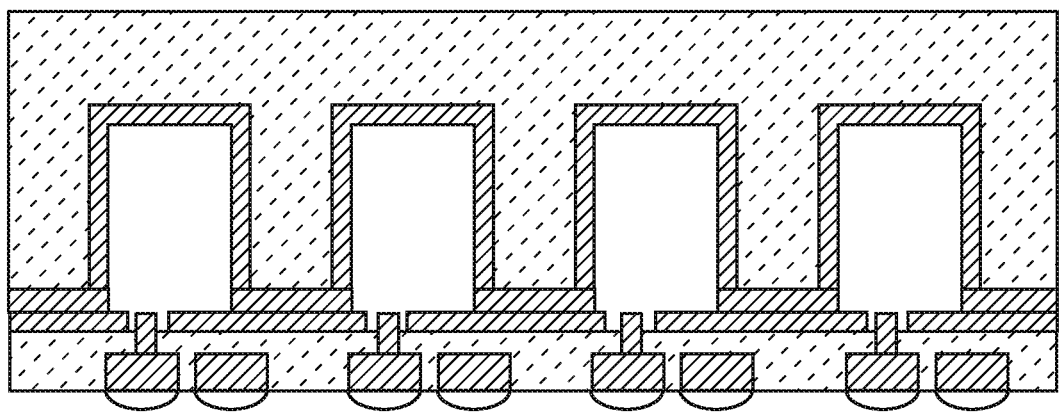

At processing block 330, the waveguide is formed by aligning the second piece of silicon having the cavity with the first piece of silicon that forms the cover. In one embodiment, the waveguide is formed by sealing the two Si pieces using metal-to-metal bonding at a high temperature (e.g., 300° C.) for 30 minutes, processing block 332. FIG. 4I illustrates one embodiment of the waveguide after the metal-to-metal bonding. At processing block 334, the waveguide is soldered on to the Si. In one embodiment, a solder on die (SOD) is applied to the pad of RF pin to enable the soldering of the waveguide to the Si. Such a connection may be made in two ways: (i) solder may be applied to pads of the TSV die; or (ii) solder may be applied to pads of the waveguide. FIG. 4J illustrates one embodiment of the waveguide after the soldering.

Once fabricated, the waveguide is attached to two or more dies. According to one embodiment, the waveguide with SOD is used to allow RF communication between two or more die, which may be on same (or different) packages. In some embodiments, the SOD may be placed on a TSV die, rather than on waveguide 240. In one embodiment, the dies are TSV die w/typical contact pads on the backside. As discussed above with reference to FIG. 2, TSV die with contact pads are connected with the RF waveguide through ACF or ACA using thermal compressive bonding.

Figure 5:
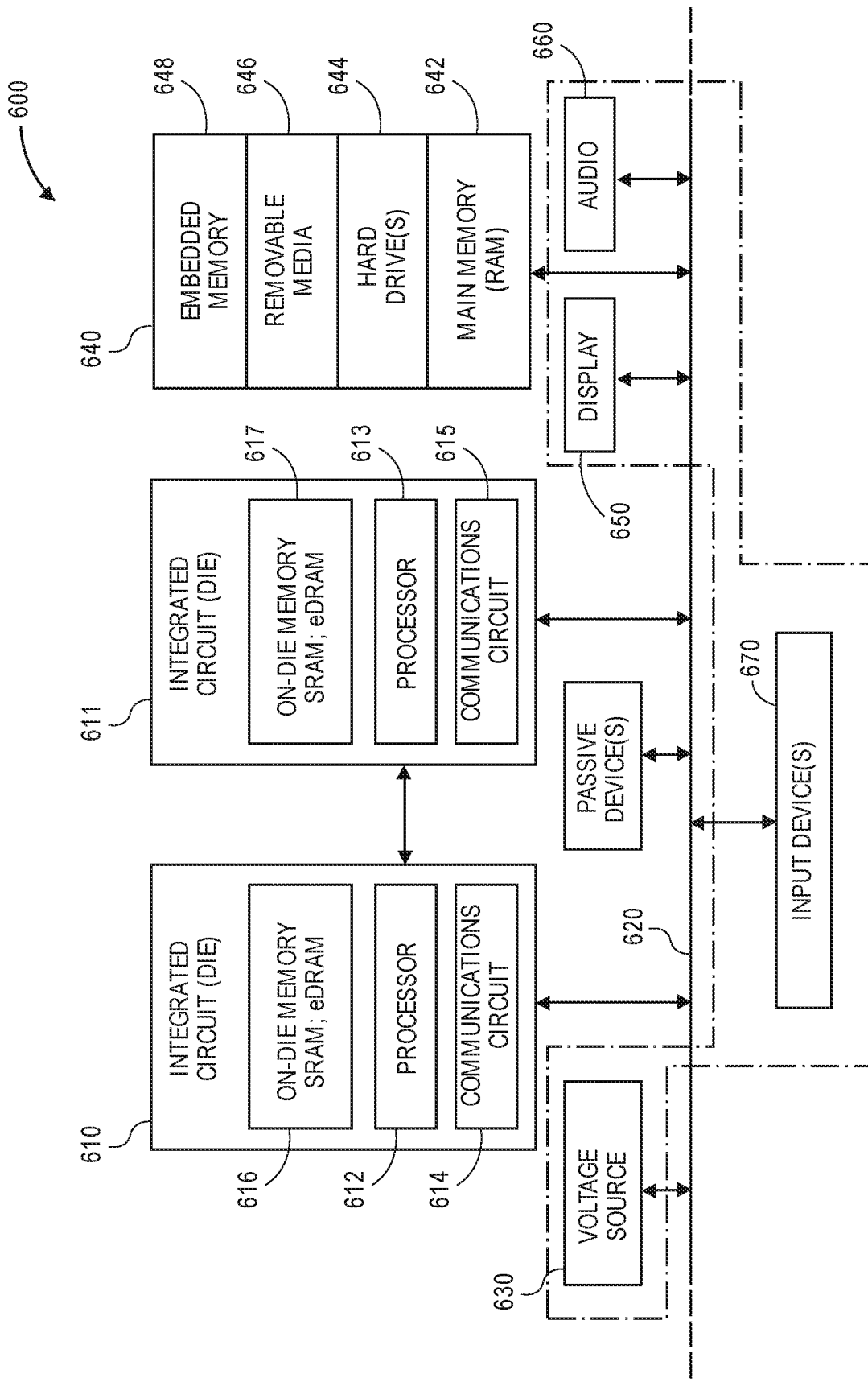
FIG. 5 illustrates a system in which a high frequency high frequency data transmission interconnect may be implemented.

FIG. 5 illustrates one embodiment of a computer system 600 in which a waveguide may be implemented. The computer system 600 (also referred to as the electronic system 600) as depicted can embody a semiconductor die packaged with one or more ACIs having metal-density layer units of fractal geometry according to any of the several disclosed embodiments and their equivalents as set forth in this disclosure. The computer system 600 may be a mobile device such as a netbook computer. The computer system 600 may be a mobile device such as a wireless smart phone. The computer system 600 may be a desktop computer. The computer system 600 may be a hand-held reader. The computer system 600 may be a server system. The computer system 600 may be a supercomputer or high-performance computing system.

In an embodiment, the electronic system 600 is a computer system that includes a system bus 620 to electrically couple the various components of the electronic system 600. The system bus 620 is a single bus or any combination of busses according to various embodiments. The electronic system 600 includes a voltage source 630 that provides power to the integrated circuit 610. In some embodiments, the voltage source 630 supplies current to the integrated circuit 610 through the system bus 620.

The integrated circuit 610 is electrically coupled to the system bus 620 and includes any circuit, or combination of circuits according to an embodiment. In an embodiment, the integrated circuit 610 includes a processor 612 that can be of any type. As used herein, the processor 612 may mean any type of circuit such as, but not limited to, a microprocessor, a microcontroller, a graphics processor, a digital signal processor, or another processor. In an embodiment, the processor 612 includes a semiconductor die packaged with one or more ACIs having metal-density layer units of fractal geometry, as disclosed herein. In an embodiment, SRAM embodiments are found in memory caches of the processor. Other types of circuits that can be included in the integrated circuit 610 are a custom circuit or an application-specific integrated circuit (ASIC), such as a communications circuit 614 for use in wireless devices such as cellular telephones, smart phones, pagers, portable computers, two-way radios, and similar electronic systems, or a communications circuit for servers. In an embodiment, the integrated circuit 610 includes on-die memory 616 such as static random-access memory (SRAM). In an embodiment, the integrated circuit 610 includes embedded on-die memory 616 such as embedded dynamic random-access memory (eDRAM).

In an embodiment, the integrated circuit 610 is complemented with a subsequent integrated circuit 611. Useful embodiments include a dual processor 613 and a dual communications circuit 615 and dual on-die memory 617 such as SRAM. In an embodiment, the dual integrated circuit 610 includes embedded on-die memory 617 such as eDRAM.

In an embodiment, the electronic system 600 also includes an external memory 640 that in turn may include one or more memory elements suitable to the particular application, such as a main memory 642 in the form of RAM, one or more hard drives 644, and/or one or more drives that handle removable media 646, such as diskettes, compact disks (CDs), digital variable disks (DVDs), flash memory drives, and other removable media known in the art. The external memory 640 may also be embedded memory 648 such as the first die in an embedded TSV die stack, according to an embodiment.

In an embodiment, the electronic system 600 also includes a display device 650, an audio output 660. In an embodiment, the electronic system 600 includes an input device such as a controller 670 that may be a keyboard, mouse, trackball, game controller, microphone, voice-recognition device, or any other input device that inputs information into the electronic system 600. In an embodiment, an input device 670 is a camera. In an embodiment, an input device 670 is a digital sound recorder. In an embodiment, an input device 670 is a camera and a digital sound recorder.

As shown herein, the integrated circuit 610 can be implemented in a number of different embodiments, including a semiconductor die packaged with one or more ACIs having metal-density layer units of fractal geometry according to any of the several disclosed embodiments and their equivalents, an electronic system, a computer system, one or more methods of fabricating an integrated circuit, and one or more methods of fabricating an electronic assembly that includes a semiconductor die packaged with one or more ACIs having metal-density layer units of fractal geometry according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor die packaged with one or more ACIs having metal-density layer units of fractal geometry embodiments and their equivalents. A foundation substrate may be included, as represented by the dashed line of FIG. 5. Passive devices may also be included, as is also depicted in FIG. 5.

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner The following clauses and/or examples pertain to further embodiments or examples. Specifics in the examples may be used anywhere in one or more embodiments. The various features of the different embodiments or examples may be variously combined with some features included and others excluded to suit a variety of different applications. Examples may include subject matter such as a method, means for performing acts of the method, at least one machine-readable medium including instructions that, when performed by a machine cause the machine to performs acts of the method, or of an apparatus or system for facilitating hybrid communication according to embodiments and examples described herein.

Some embodiments pertain to Example 1 that includes an integrated circuit (IC) comprising a substrate, a first die mounted on the substrate, a second die mounted on the substrate and a waveguide structure mounted on the first die and the second die to enable high frequency wireless communication between the first die and the second die.

Example 2 includes the subject matter of Example 1, wherein the substrate comprises a bridge to facilitate high-speed digital communication between the first die and the second die.

Example 3 includes the subject matter of Examples 1 and 2, wherein the first die and the second die each comprise one or more through silicon vias (TSVs) to interconnect the first die and the second die to the waveguide.

Example 4 includes the subject matter of Examples 1-3, wherein the first die and the second die each comprise a contact pad to couple the TSVs to the waveguide.

Example 5 includes the subject matter of Examples 1-4, wherein the contact pads comprise an anisotropic conductive film (ACF).

Example 6 includes the subject matter of Examples 1-5, wherein the contact pads comprise an anisotropic conductive adhesive (ACA) using thermal compressive bonding.

Example 7 includes the subject matter of Examples 1-6, wherein the waveguide is an air filled dielectric.

Example 8 includes the subject matter of Examples 1-7, wherein the waveguide comprises one or more channels.

Some embodiments pertain to Example 9 that includes a method comprising fabricating a waveguide structure to enable high frequency wireless communication between the first die and the second die, including fabricating a top cover of the waveguide, fabricating a cavity of the waveguide and combining the top cover and the cavity to form the waveguide.

Example 10 includes the subject matter of Example 10, wherein fabricating the top cover comprises patterning a first wafer to create a radio frequency (RF) pin and applying a copper plate on to the RF pin.

Example 11 includes the subject matter of Examples 9 and 10, wherein fabricating the top cover further comprises etching the first wafer, sputtering a metal on the cavity and patterning the metal in the cavity.

Example 12 includes the subject matter of Examples 9-11, wherein fabricating the cavity further comprises patterning a front side of a second wafer to create an opening and sputtering a metal on the cavity.

Example 13 includes the subject matter of Examples 9-12, wherein fabricating the cavity comprises fabricating a plurality of cavities to facilitate a plurality of waveguide signal channels.

Example 14 includes the subject matter of Examples 9-13, wherein combining the top cover and the cavity comprises aligning the second piece of silicon having the cavity with the first piece of silicon that forms the cover and bonding the waveguide.

Example 15 includes the subject matter of Examples 9-14, further comprising attaching the waveguide to the first die and the second die.

Some embodiments pertain to Example 16 that includes an integrated circuit (IC) comprising a first substrate, a first die mounted on the first substrate, a second substrate, a second die mounted on the second substrate and a waveguide structure mounted on the first die and the second die to enable high frequency wireless communication between the first die and the second die.

Example 17 includes the subject matter of Example 16, wherein the first die and the second die each comprise one or more through silicon vias (TSVs) to interconnect the first die and the second die to the waveguide.

Example 18 includes the subject matter of Examples 16 and 17, wherein the first die and the second die each comprise a contact pad to couple the TSVs to the waveguide.

Example 19 includes the subject matter of Examples 16-18, wherein the contact pads comprise an anisotropic conductive film (ACF).

Example 20 includes the subject matter of Examples 16-19, wherein the contact pads comprise an anisotropic conductive adhesive (ACA) using thermal compressive bonding.

Example 21 includes the subject matter of Examples 16-20, wherein the waveguide comprises one or more channels.

Example 22 includes the subject matter of Examples 16-21, further comprising a third substrate, a third die mounted on the third substrate and a second waveguide structure mounted on the first die and the third die to enable high frequency wireless communication between the first die and the third die.

Although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. An integrated circuit (IC) comprising:
    a substrate;

a first die having an active side opposite a backside, the active side mounted on the substrate;

a second die having an active side opposite a backside, the active side mounted on the substrate, wherein the substrate comprises a bridge, the bridge directly electrically connecting the second die to the first die; and a waveguide structure mounted on the backside of the first die and the backside of the second die to enable high frequency wireless communication between the first die and the second die, wherein the first die and the second die each comprise one or more through silicon vias (TSVs) to interconnect the first die and the second die to the waveguide structure, and wherein the TSVs do not contact the substrate.

2. The IC of claim 1, wherein the bridge is to facilitate high-speed digital communication between the first die and the second die.

3. The IC of claim 1, wherein the first die and the second die each comprise a contact pad to couple the TSVs to the waveguide structure.

4. The IC of claim 3, wherein the contact pads comprise an anisotropic conductive film (ACF).

5. The IC of claim 3, wherein the contact pads comprise an anisotropic conductive adhesive (ACA) using thermal compressive bonding.

6. The IC of claim 1, wherein the waveguide structure is an air filled dielectric.

7. The IC of claim 6, wherein the waveguide structure comprises one or more channels.

8. A method comprising:

fabricating a waveguide structure to enable high frequency wireless communication between a first die and a second die, including fabricating a top cover of the waveguide;

fabricating a cavity of the waveguide;

combining the top cover and the cavity to form the waveguide, the waveguide to enable high frequency wireless communication within the cavity;

mounting an active side of the first die on a substrate and mounting an active side of the second die on the substrate; and attaching the waveguide to a backside of the first die and to a backside of the second die, wherein the first die and the second die each comprise one or more through silicon vias (TSVs) to interconnect the first die and the second die to the waveguide structure, and wherein the TSVs do not contact the substrate.

9. The method of claim 8, wherein fabricating the top cover comprises:

patterning a first wafer to create a radio frequency (RF) pin; and applying a copper plate on to the RF pin.

10. The method of claim 9, wherein fabricating the top cover further comprises:

etching the first wafer;

sputtering a metal on the cavity; and patterning the metal in the cavity.

11. The method of claim 10, wherein fabricating the cavity further comprises: patterning a front side of a second wafer to create an opening; and sputtering a metal on the cavity.

12. The method of claim 11, wherein fabricating the cavity comprises fabricating a plurality of cavities to facilitate a plurality of waveguide signal channels.

13. The method of claim 11, wherein combining the top cover and the cavity comprises: aligning the second piece of silicon having the cavity with the first piece of silicon that forms the cover; and bonding the waveguide.

14. An integrated circuit (IC) comprising:

a first substrate;

a first die having an active side opposite a backside, the active side mounted on the first substrate;

a second substrate;

a second die having an active side opposite a backside, the active side mounted on the second substrate;

a waveguide structure mounted on the backside of the first die and the backside of the second die to enable high frequency wireless communication between the first die and the second die; and a printed circuit board coupled to the first substrate and the second substrate, wherein the printed circuit board comprises interconnects directly electrically connecting the second die to the first die, wherein the first die and the second die each comprise one or more through silicon vias (TSVs) to interconnect the first die and the second die to the waveguide structure, and wherein the TSVs do not contact the printed circuit board.

15. The IC of claim 14, wherein the first die and the second die each comprise a contact pad to couple the TSVs to the waveguide structure.

16. The IC of claim 15, wherein the contact pads comprise an anisotropic conductive film (ACF).

17. The IC of claim 15, wherein the contact pads comprise an anisotropic conductive adhesive (ACA) using thermal compressive bonding.

18. The IC of claim 14, wherein the waveguide structure comprises one or more channels.

19. The IC of claim 14, further comprising:

a third substrate;

a third die mounted on the third substrate; and a second waveguide structure mounted on the first die and the third die to enable high frequency wireless communication between the first die and the third die.

20. A method comprising:

fabricating a waveguide structure to enable high frequency wireless communication between a first die and a second die, including fabricating a top cover of the waveguide, wherein fabricating the top cover comprises patterning a first wafer to create a radio frequency (RF) pin, and applying a copper plate on to the RF pin;

fabricating a cavity of the waveguide;

combining the top cover and the cavity to form the waveguide;

mounting an active side of the first die on a substrate and mounting an active side of the second die on the substrate; and attaching the waveguide to a backside of the first die and to a backside of the second die.

* * * * *